United States Patent [19]

Hubbell et al.

[11] Patent Number: 4,886,163

[45] Date of Patent: Dec. 12, 1989

[54] ELECTROSTATIC DISSIPATIVE MAINTENANCE AID MODULE CONTAINER

[75] Inventors: Nelson M. Hubbell, Niantic; Susan L. Murdock, Ledyard; Ernest P. Romano, Groton, all of Conn.

[73] Assignee: The United States of America as represented by the Secretary of the Navy, Washington, D.C.

[21] Appl. No.: 341,600

[22] Filed: Apr. 21, 1989

[51] Int. Cl.[4] ............................................. B65D 73/02
[52] U.S. Cl. ................................. 206/334; 206/328; 206/521; 190/107; 220/4 F
[58] Field of Search ................ 206/328, 334, 521; 190/107; 220/4 F

[56] References Cited

U.S. PATENT DOCUMENTS

| | | | |
|---|---|---|---|
| 4,494,651 | 1/1985 | Malcolm | 206/328 |
| 4,593,813 | 6/1986 | Powel | 206/328 |
| 4,684,020 | 8/1987 | Ohlbach | 206/328 |
| 4,712,674 | 12/1987 | Young | 206/328 |
| 4,772,079 | 9/1988 | Douglas et al. | 206/328 |
| 4,792,042 | 12/1988 | Koehn et al. | 206/328 |

*Primary Examiner*—Joseph Man-Fu Moy
*Attorney, Agent, or Firm*—Arthur A. McGill; Prithvi C. Lall; Michael J. McGowan

[57] ABSTRACT

A container for holding circuit cards within a plastic, static dissipative enclosure. The container has a handle and is sturdy enough for carrying as a suitcase. The design can be varied so that various circuit card sizes and shapes can be accommodated. The container is suitable for stacking with another like container. Detachable slides are affixed to the container for mounting in a cabinet.

7 Claims, 1 Drawing Sheet

U.S. Patent  Dec. 12, 1989  4,886,163
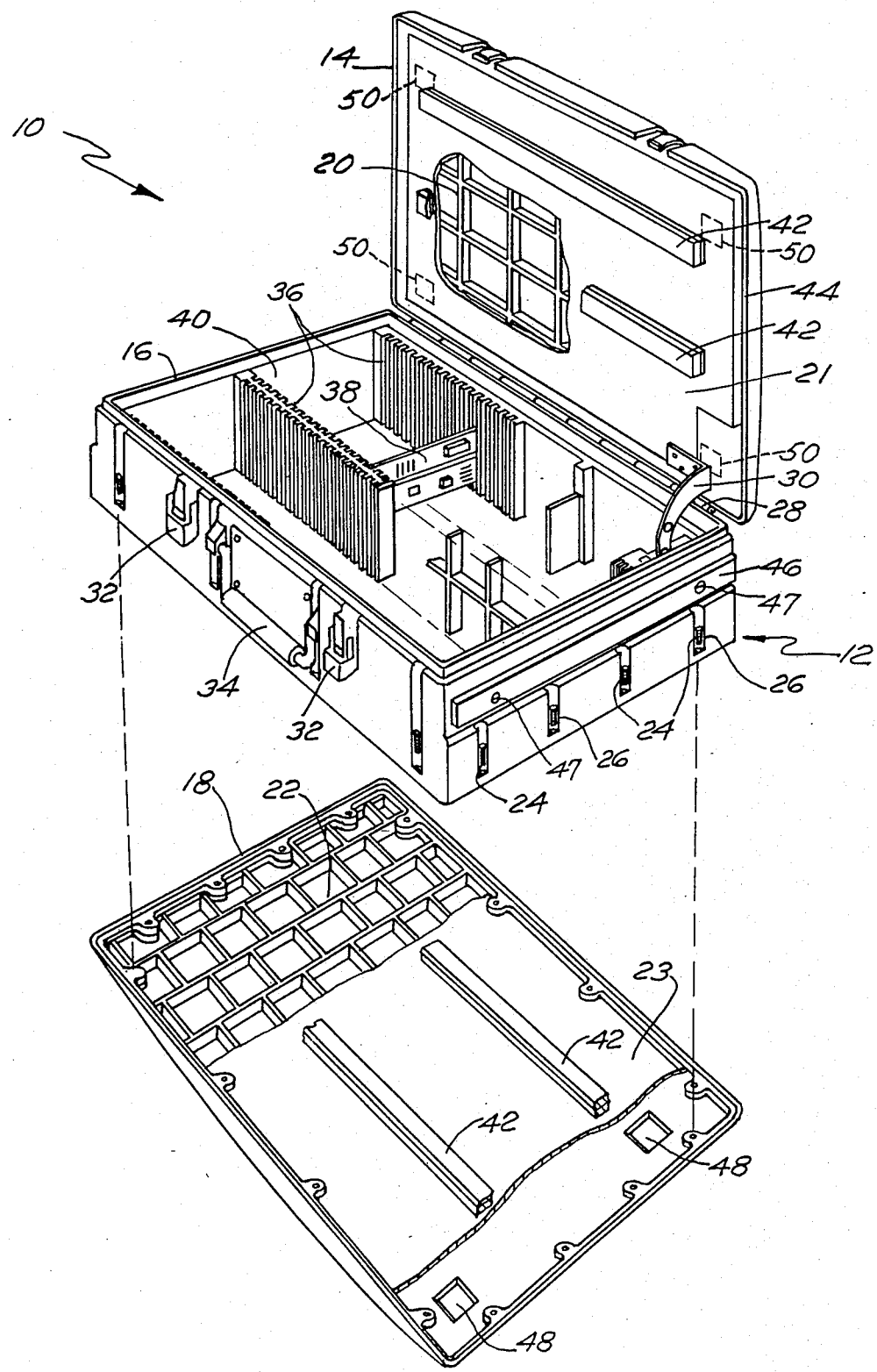

ELECTROSTATIC DISSIPATIVE MAINTENANCE AID MODULE CONTAINER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention generally relates to containers to hold circuit cards and more particularly to a portable container particularly suitable for holding circuit cards and protecting them from electrostatic discharge damage.

(2) Description of the Prior Art

Maintenance Assistance Modules (MAMs) are used to test failed electronic equipment. These MAMs are used to isolate a fault by swapping the MAMs, with the unknown or faulty cards. It is important the MAMs be protected from electrostatic discharge damage; faulty MAM cards are intolerable. The existing containers for MAM cards are made out of sheet metal, have much wasted space, do not provide electrostatic discharge protection, and any variation to the existing design is expensive.

SUMMARY OF THE INVENTION

It is therefore an object of the invention to provide a circuit card container that provides electrostatic discharge protection. Another object is that the container has its compartments more efficiently arranged. Further objects are that the container be portable, suitable for securing to a cabinet and shock resistant. These and other objects will become more apparent from the following description.

The above objects are realized by providing a container with the housing made of an electrostatic dissipative plastic. In order to be electrostatic dissipative protective all attachments to the plastic housing are made of static dissipative or conductive material and connect to the housing electrically as well as mechanically. Newly designed features include the handle, rest bumpers, stack feature, spring card holders, and a cabinet latch for securing the container within a cabinet.

BRIEF DESCRIPTION OF THE DRAWING

The figure shows an exploded view of the container in accordance with the present invention.

DESCRIPTION OF THE PREFERRED EMBODIMENT

Referring now to the figure there is shown an exploded view of the container 10. The container 10 is in the form of a suitcase and includes three components that together form a housing 12. The housing 12 is made of a static dissipative plastic material. The material used is made of a glass, carbon, and plastic compound. Static dissipative plastic material is well known to those of skill in the art and is commercially available from a number of manufacturers.

The parts forming the housing 12 comprise three injection molded electrostatic dissipative components including the domed top lid 14, middle section 16, and bottom section 18. The domed lid 14 and bottom section 18 are configured with inner moldings 20, 22 that have identical ribbing patterns for optimum strength. The inner moldings 20, 22 are sonically welded to respective cover plates 21, 23 made of static dissipative plastic material. Bottom section 18 is attached to middle section 16 by threaded fasteners 24 installed into sonic inserts 26. The domed top lid 14 is connected by a hinge 28 to the middle section 16 and protection is provided by a lid support latch 30.

Hasps 32 and handle 34 are either conductive or static dissipative and are electrically connected to the container 12. The middle section 16 is a variable depth configuration and has holding slots 36 to hold a plurality of module assemblies such as module assembly 38. Each slot 36 provides for installation of a spring device 40 which exerts pressure on each module assembly 38 holding the module assembly 38 firmly to prevent any vibration of the module 38. Module assembly 38 does not form a part of container 10.

Conductive rubber cushion strips 42 are located on the inside of the lid 14 and bottom 18 to hold each assembled module 38. A cover seal 44 is also conductive and affixed adhesively to provide a watertight seal. The middle section 16 of the container 10 has detachable slides 46 affixed with screws 47. The slides 46 are for mounting in a cabinet (not shown). The bottom section 18 has rest bumpers 48. The rest bumpers 48 form a stacking feature with indents 50.

Three molds are required in the construction of this container 10; one each for the lid 14, bottom section 18, and middle section 16. This allows for easy modification of the container. The middle section 16 can be varied in depth and module assembly 38 arrangement for each container 10. The lid 14 and bottom 18 are constant for each container 10.

The primary function of the invention is to make the container 10 electrostatic dissipative protective. To be electrostatic dissipative protective, all attachments to the plastic housing 12 must be made of static dissipative or conductive material and be connected to the housing 12 electrically as well as mechanically. All attachments are MILSPEC. Newly designed features include the handle 34, rest bumpers 48 with indents 50 for stacking, card holders 36, spring devices 40, and detachable slides 46 for securing the container 10 in a cabinet. Module holding slots 36 are incorporated into the design to allow for the addition of modules 38.

As previously stated the housing 12 is made of a glass, carbon, and plastic compound. The electrostatic dissipative protection comes from a carbon powder throughout the compound, the strength comes from glass fibers, and the versatility of the design is provided by the plastic.

The container 10 can be a stand alone unit or racked in a cabinet. This container 10 is designed to hold modules 38 that are troubleshooting circuit cards for submarine sonar systems but appear to be suitable for surface craft and aircraft use. Container 10 can be used commercially for the transporting of any electrostatic dissipative sensitive equipment.

It will be understood that various changes in details, materials, steps and arrangements of parts, which have been herein described and illustrated in order to explain the nature of the invention, may be made by those skilled in the art within the principle and scope of the invention as expressed in the appended claims.

What is claimed is:

1. An electrostatic dissipative maintenance aid module container comprising:
   an electrostatic dissipative housing in suitcase form including an electrostatic dissipative lid, an electrostatic dissipative middle section, and an electrostatic dissipative bottom section; and
   said lid and said bottom section having inner molding ribbing patterns.

2. An electrostatic dissipative maintenance aid module container according to claim 1 further comprising:
   said middle section adapted to be of variable length;
   threaded fasteners connecting said bottom section to said middle section; and
   a hinge and a hasp connecting said lid to said middle section.

3. An electrostatic dissipative maintenance aid module container according to claim 2 further comprising:
   electrostatic dissipative cover plates covering and connected to respective inner moldings; and
   conductive rubber cushion strips connected to said cover plates on the opposite side of said cover plates from said inner moldings.

4. An electrostatic dissipative maintenance aid module container according to claim 3 further comprising:
   said middle section further having sonic inserts; and
   said threaded fasteners connecting said bottom section to said middle section being installed into said sonic inserts.

5. An electrostatic dissipative maintenance aid module container according to claim 4 further comprising:
   a handle having an electrically conductive attachment to said middle section; and
   a conductive cover seal connected to said lid.

6. An electrostatic dissipative maintenance aid module container according to claim 5 further comprising:
   a pair of slides with each slide connected to opposite sides of said middle section;
   said bottom section further having rest bumpers; and
   said lid further having indents aligned with said rest bumpers.

7. An electrostatic dissipative maintenance aid module container according to claim 6 further comprising said dome, said middle section and said bottom section each comprise an injection molded electrostatic dissipative component.

* * * * *